(12) United States Patent
Tanaka

(10) Patent No.: US 12,074,132 B2
(45) Date of Patent: Aug. 27, 2024

(54) SEMICONDUCTOR DEVICE, POWER CONVERTER, AND METHOD OF MANUFACTURING SEMICONDUCTOR DEVICE

(71) Applicant: Mitsubishi Electric Corporation, Tokyo (JP)

(72) Inventor: Yo Tanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 353 days.

(21) Appl. No.: 17/598,871

(22) PCT Filed: May 22, 2019

(86) PCT No.: PCT/JP2019/020306
§ 371 (c)(1),
(2) Date: Sep. 28, 2021

(87) PCT Pub. No.: WO2020/235056
PCT Pub. Date: Nov. 26, 2020

(65) Prior Publication Data
US 2022/0157767 A1 May 19, 2022

(51) Int. Cl.
*H01L 23/00* (2006.01)
*H01L 23/12* (2006.01)
(Continued)

(52) U.S. Cl.
CPC .............. *H01L 24/48* (2013.01); *H01L 23/12* (2013.01); *H01L 23/3121* (2013.01);
(Continued)

(58) Field of Classification Search
CPC ......... H01L 24/48; H01L 24/05; H01L 24/06; H01L 24/45; H01L 24/32; H01L 24/33;
(Continued)

(56) References Cited

U.S. PATENT DOCUMENTS

2012/0168919 A1* 7/2012 Eom ................... H01L 23/4334
257/E21.502
2014/0346676 A1* 11/2014 Horio .................... H01L 25/072
257/773
2017/0133308 A1  5/2017 Inaba et al.

FOREIGN PATENT DOCUMENTS

JP  4-65137 A  3/1992
JP  11-251351 A  9/1999
(Continued)

OTHER PUBLICATIONS

International Search Report and Written Opinion mailed on Aug. 6, 2019, received for PCT Application PCT/ JP2019/020306, Filed on May 22, 2019, 10 pages including English Translation.

*Primary Examiner* — Marcos D. Pizarro
*Assistant Examiner* — Tiberiu Dan Onuta
(74) *Attorney, Agent, or Firm* — XSENSUS LLP

(57) ABSTRACT

A semiconductor device includes a first circuit, a second circuit, a wiring member, and a bonding material. The wiring member is connected to one of the first circuit and the second circuit. The bonding material is connected to the other of the first circuit and the second circuit. The wiring member includes a first end, a second end, and a top. The first end and the second end are connected to one of the first circuit and the second circuit. The top is located between the first end and the second end. The top is connected to the other of the first circuit and the second circuit with the bonding material in between.

8 Claims, 12 Drawing Sheets

(51) Int. Cl.
*H01L 23/31* (2006.01)
*H01L 23/367* (2006.01)

(52) U.S. Cl.
CPC .......... *H01L 23/3675* (2013.01); *H01L 24/05* (2013.01); *H01L 24/06* (2013.01); *H01L 2224/05101* (2013.01); *H01L 2224/0603* (2013.01); *H01L 2224/4813* (2013.01); *H01L 2224/4846* (2013.01)

(58) Field of Classification Search
CPC .......... H01L 24/83; H01L 24/29; H01L 23/12; H01L 23/3121; H01L 23/3675; H01L 23/3735; H01L 23/49811; H01L 23/5385; H01L 23/36; H01L 25/07; H01L 25/18; H01L 29/78; H01L 2924/10253; H01L 2924/1203; H01L 2924/13055; H01L 2924/13091; H01L 2924/19107; H01L 2924/10272; H01L 2224/05101; H01L 2224/0603; H01L 2224/4813; H01L 2224/4846; H01L 2224/05624; H01L 2224/05639; H01L 2224/05644; H01L 2224/05647; H01L 2224/05655; H01L 2224/06181; H01L 2224/29111; H01L 2224/29116; H01L 2224/29118; H01L 2224/29124; H01L 2224/29139; H01L 2224/29147; H01L 2224/2929; H01L 2224/29339; H01L 2224/32225; H01L 2224/3303; H01L 2224/45124; H01L 2224/45139; H01L 2224/45147; H01L 2224/8382; H01L 2224/48505; H01L 2224/83447; H01L 2224/8385; H01L 2224/85424; H01L 2224/85444; H01L 2224/85447; H01L 2224/85455; H01L 2224/33181

See application file for complete search history.

(56) References Cited

FOREIGN PATENT DOCUMENTS

| | | |
|---|---|---|
| JP | 2009-64852 A | 3/2009 |
| JP | 2011-23748 A | 2/2011 |
| JP | 2015-138824 A | 7/2015 |
| JP | 2017-92185 A | 5/2017 |

\* cited by examiner

SEMICONDUCTOR DEVICE, POWER CONVERTER, AND METHOD OF MANUFACTURING SEMICONDUCTOR DEVICE

CROSS-REFERENCE TO RELATED APPLICATION

The present application is based on PCT filing PCT/JP2019/020306, filed May 22, 2019, the entire contents of which are incorporated herein by reference.

TECHNICAL FIELD

The present invention relates to a semiconductor device, a power converter, and a method of manufacturing a semiconductor device.

BACKGROUND ART

In a conventional semiconductor device including a power semiconductor element for electrical power, the power semiconductor element is required to have a higher power density (higher current density) for miniaturization of the semiconductor device. A large current is thus applied to the power semiconductor element, and accordingly, a plate-shaped metallic member is used for a circuit of the power semiconductor element.

For example, Japanese Patent Laying-Open No. 2015-138824 (PTL 1) discloses a semiconductor device in which a power semiconductor element and an electrode formed of a plate-shaped metallic member are connected by a bonding wire. The bonding wire has a loop shape connected to the power semiconductor element at two locations and is joined to the electrode at the top of the loop shape.

CITATION LIST

Patent Literature

PTL 1: Japanese Patent Laying-Open No. 2015-138824

SUMMARY OF INVENTION

Technical Problem

In the semiconductor device disclosed in PTL 1, the bonding wire is joined to the electrode at the top of the loop shape. This leads to a smaller contact area at a joint between the top of the bonding wire and the electrode. Thus, the semiconductor device has a small allowance for development of a crack at the joint after repeated application of thermal or mechanical fatigue to the joint. This results in a low thermal resistance of the joint.

The present invention has been made in view of the above problem, and an object thereof is to provide a semiconductor device that can have a higher thermal resistance of a joint, a power converter including the semiconductor device, and a method of manufacturing the semiconductor device.

Solution to Problem

A semiconductor device of the present invention includes a first circuit, a second circuit, a wiring member, and a bonding material. The wiring member is connected to one of the first circuit and the second circuit. The bonding material is connected to the other of the first circuit and the second circuit. The wiring member includes a first end, a second end, and a top. The first end and the second end are connected to one of the first circuit and the second circuit. The top is located between the first end and the second end. The top is connected to the other of the first circuit and the second circuit with the bonding material in between.

Advantageous Effects of Invention

In the semiconductor device according to the present invention, the top of the wiring member is connected to the other of the first circuit and the second circuit with the bonding material in between, leading to a larger contact area of the joint between the top of the wiring member and the bonding material. This leads to a larger acceptable amount for the development of a crack at the joint after repeated application of thermal or mechanical fatigue to the joint. This results in a higher thermal resistance of the joint.

DESCRIPTION OF EMBODIMENTS

Figure 1:
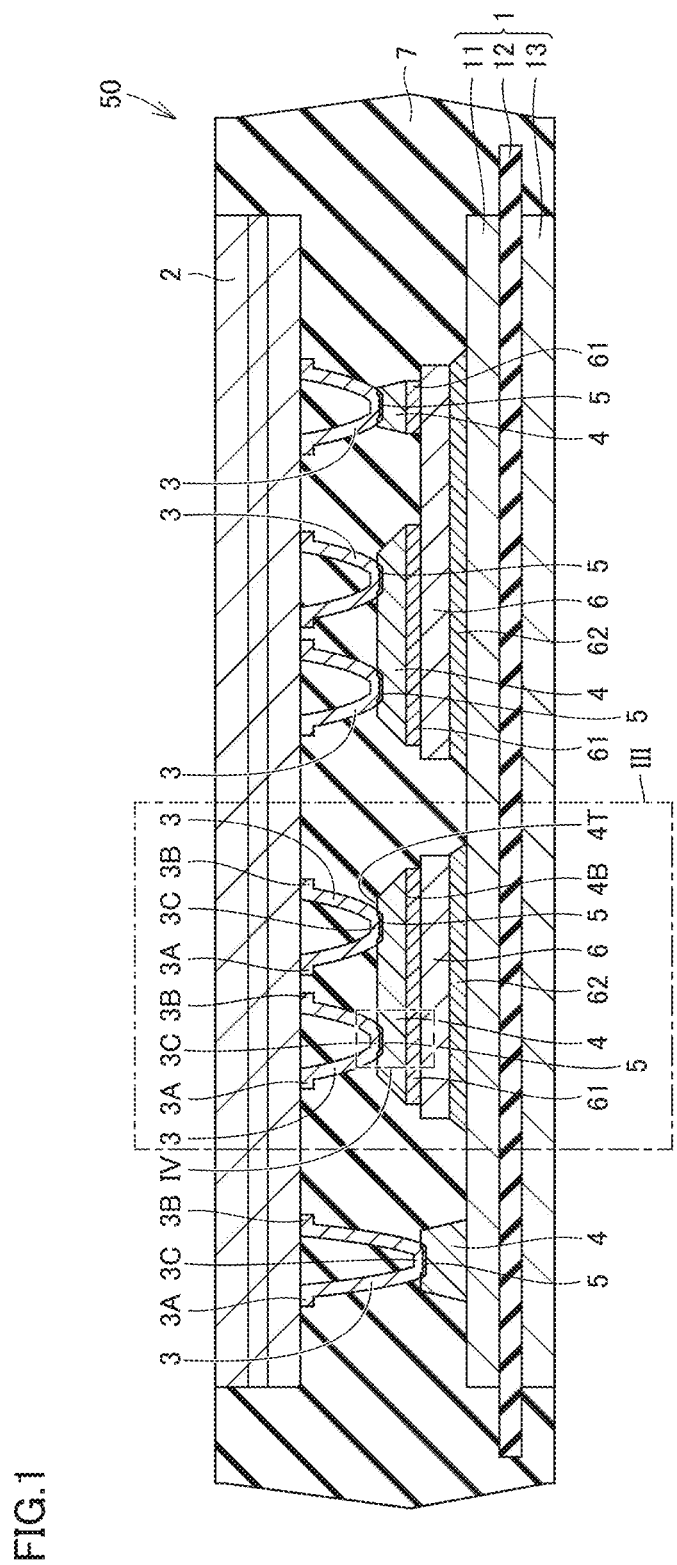
FIG. 1 is a sectional view schematically showing a configuration of a semiconductor device according to Embodiment 1 of the present invention.

The embodiments of the present invention will now be described with reference to the drawings. The same or corresponding parts in the drawings have the same reference characters allotted, and redundant description will not be repeated.

Embodiment 1

Figure 2:
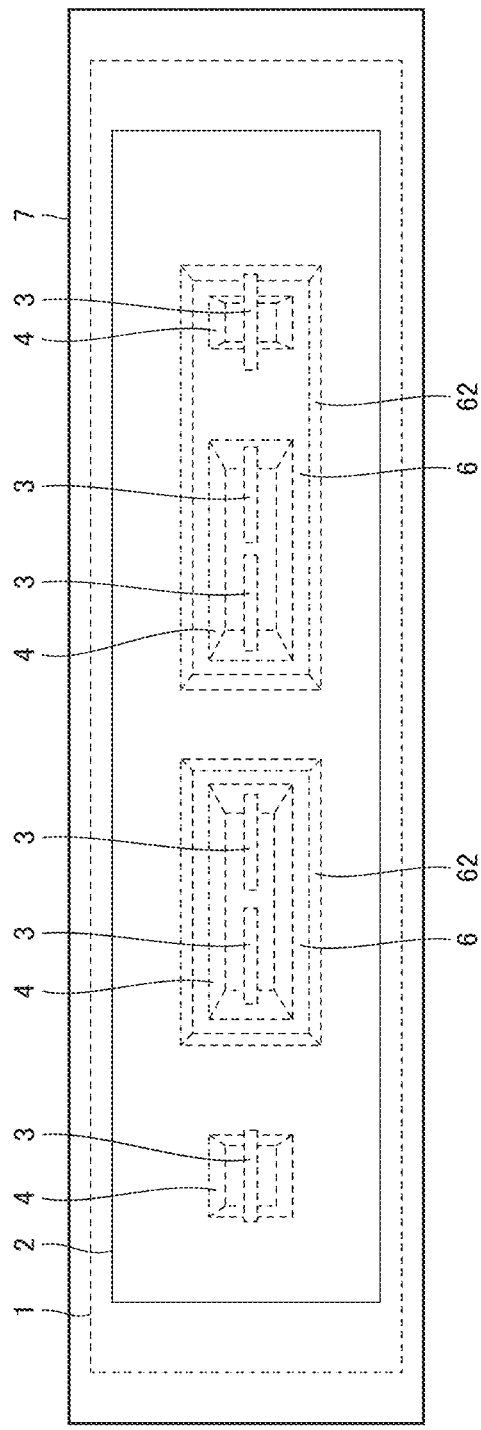
FIG. 2 is a plan view schematically showing the configuration of the semiconductor device according to Embodiment 1 of the present invention.
Figure 3:
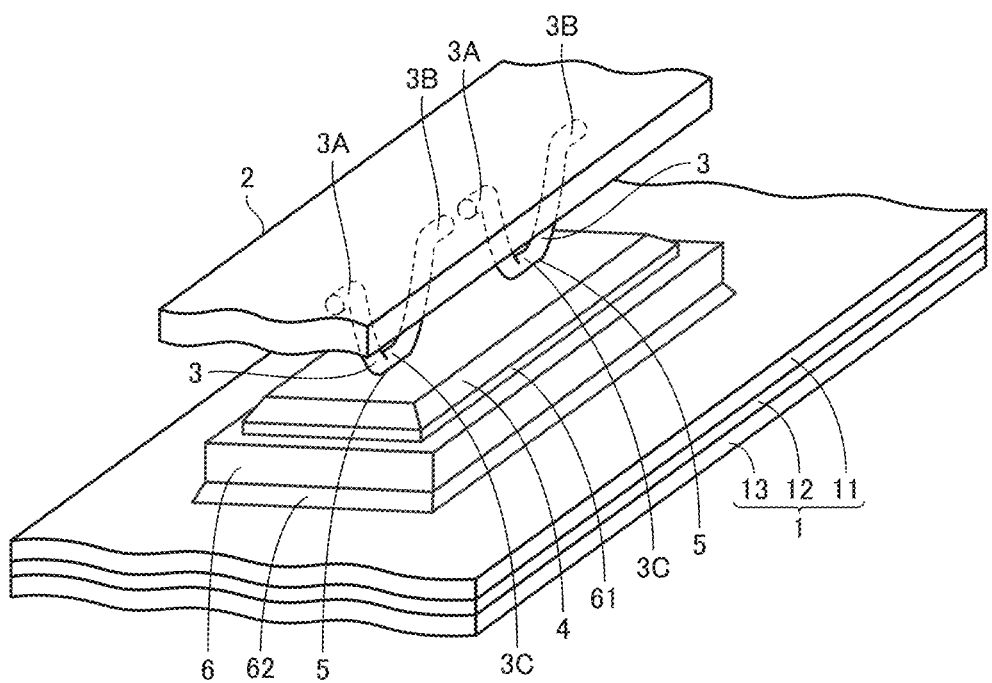
FIG. 3 is an enlarged perspective view of a portion III of FIG. 1, which schematically shows the configuration of the semiconductor device according to Embodiment 1 of the present invention.

A configuration of a semiconductor device 50 according to Embodiment 1 of the present invention will be described with reference to FIGS. 1 to 3. FIG. 1 is a sectional view schematically showing the configuration of semiconductor device 50 according to Embodiment 1. FIG. 2, is a plan view schematically showing the configuration of semiconductor device 50 according to Embodiment 1. FIG. 3 is an enlarged perspective view of a portion III of FIG. 1, which schematically shows the configuration of semiconductor device 50 according to Embodiment 1. Note that a sealing resin 7 is not shown in FIG. 3 for convenience of description. As shown in FIGS. 1 and 2 semiconductor device 50 mainly includes a first circuit 1, a second circuit 2, a wiring member 3, a bonding material 4, an alloy layer 5, a semiconductor element 6, and scaling resin 7. Semiconductor device 50 is a power semiconductor device for power. Semiconductor element 6 is a power semiconductor element for power. Although semiconductor device 50 includes one power module including two power semiconductor elements in FIGS. 1 and 2, semiconductor device 50 may include a plurality of power modules.

First circuit 1 includes a circuit pattern 11, an insulating layer 12, and a metallic layer 13. First circuit 1 is electrically connected with semiconductor element 6.

For example, copper (Cu) is used for circuit pattern 11 and metallic layer 13 of first circuit 1. Note that the material for circuit pattern 11 and metallic layer 13 is not limited thereto. The material for circuit pattern 11 and metallic layer 13 is preferably a material having a high electrical conductivity. Although circuit pattern 11 is shown integrally in FIGS. 1 and 2, circuit pattern 11 generally has a shape in which electrically isolated rectangles are arranged.

Insulating layer 12 of first circuit 1 is, for example, a ceramic substrate. The material of the ceramic substrate is, for example, alumina (aluminum oxide), an aluminum nitride, or a silicon nitride. The material of the ceramic substrate is not limited thereto. Insulating layer 12 may be, for example, not only the ceramic substrate but also an organic material filled with ceramic fillers. Such an organic material is, for example, an epoxy resin, a polyimide resin, or a cyanate resin. The ceramic filler is, for example, alumina, aluminum nitride, or boron nitride.

First circuit 1 is, for example, a printed circuit board. The shape of first circuit 1 may be determined in accordance with the shape of semiconductor device 50. Circuit pattern 11 and metallic layer 13 are provided on the opposite surfaces of insulating layer 12. Preferably, it suffices that the material for circuit pattern 11 and metallic layer 13 can be joined with insulating layer 12 by direct bonding or active metal bonding so as to be firmly joined with insulating layer 12. Herein, direct bonding is a method of joining circuit pattern 11 and metallic layer 13 to insulating layer 12 by direction reaction. Active metal bonding is a method of joining circuit pattern 11 and metallic layer 13 to insulating layer 12 with a brazing material containing an active metal such as titanium (Ti) or zirconium (Zr).

Second circuit 2 is electrically connected with wiring member 3. Second circuit 2 is, for example, a circuit board. Specifically, second circuit 2 is, for example, a printed circuit board. A wiring pattern (not shown), an electronic component (not shown), and the like are mounted on second circuit 2. In terms of electrical characteristics and mechanical characteristics, the material of second circuit 2 may be aluminum (Al), copper (Cu), nickel (Ni), gold (Au), or an alloy mainly including any one of them. Although one second circuit 2 is shown in FIG. 1, any number of second circuits 2 may be provided. Second circuit 2 is shaped to connect electrically connectable portions in accordance with the arrangement of circuit pattern 11.

Wiring member 3 is connected to one of first circuit 1 and second circuit 2. In the present embodiment, wiring member 3 is connected to second circuit 2. Wiring member 3 includes a first end 3A, a second end 3B, and a top 3C. First end 3A and second end 3B are connected to second circuit 2. Specifically, first end 3A and second end 3B are directly joined to second circuit 2. Top 3C is located between first end 3A and second end 3B. In other words, top 3C is disposed between first end 3A and second end 3B of wiring member 3. In the present embodiment, top 3C is connected to first circuit 1 with bonding material 4 in between. Top 3C is connected to semiconductor element 6 with bonding material 4 in between. In other words, top 3C is connected to first circuit 1 with bonding material 4 and semiconductor element 6 in between.

As shown in FIGS. 1 and 3, wiring member 3 has elasticity and is shaped so as to bend flexibly. Wiring member 3 thus has so-called flexibility. Wiring member 3 forms a loop with the opposite ends thereof joined. Wiring member 3 is substantially U-shaped. Wiring member 3 is, for example, a wire or a plate-shaped member. In the present embodiment, wiring member 3 is a wire. In other words, wiring member 3 has a cylindrical shape. First end 3A and second end 3B of wiring member 3 are joined to second circuit 2. The method of joining wiring member 3 to second circuit 2 is, for example, ultrasonic bonding. Wiring member 3 is made of a metallic material. The material of wiring member 3 is, for example, aluminum (Al), copper (Cu), silver (Ag), art alloy mainly composed of them, or the like.

Bonding material 4 is connected to one of first circuit 1 and second circuit 2. In the present embodiment, bonding material 4 is connected to first circuit 1. Specifically, bonding material 4 is disposed on a pad 61 of semiconductor element 6. Bonding material 4 is connected to semiconductor element 6. Bonding material 4 is provided between circuit pattern 11 of first circuit 1 and wiring member 3, and between pad 61 of semiconductor element 6 and wiring member 3. Bonding material 4 is joined to top 3C of wiring member 3. Bonding material 4 includes a joint surface 4T and a back surface 4B. Joint surface 4T is joined to top 3C of wiring member 3. Back surface 4B is disposed opposite to joint surface 4T with respect to the center of bonding material 4. Bonding material 4 is joined to any of circuit pattern 11 of first circuit 1 and pad 61 of semiconductor element 6. In other words, back surface 4B is joined to any of circuit pattern 11 of first circuit 1 and semiconductor element 6. Specifically, in bonding material 4 disposed on the leftmost side in FIG. 1, back surface 4B is joined to circuit pattern 11 of first circuit 1. In each of three bonding materials 4 disposed on the right of bonding material 4 disposed on the leftmost side in FIG. 1, back surface 4B is joined to semiconductor element 6. Bonding material 4 is not in contact with second circuit 2. Although bonding material 4 is provided on circuit pattern 11 of first circuit 1 and on pad 61 of semiconductor element 6 in FIG. 1, bonding material 4 may be disposed in any one of these locations.

The main constituents of bonding material 4 are a metallic element and a melting point depressing element same as those of wiring member 3. For example, the main constituents of bonding material 4 are a combination of, for example, aluminum (Al)—zinc (Zn), copper (Cu)—tin (Sn), or silver (Ag)—tin (Sn). Specifically, bonding material 4 includes aluminum (Al) and further zinc (Zn), which is the melting point depressing element, when the main metallic element of wiring member 3 is aluminum (Al). Bonding material 4 includes copper (Cu) and tin (Sn), which is the melting point depressing element, when the main metallic element of wiring member 3 is copper (Cu). Bonding material 4 includes silver (Ag) and further tin (Sn), which is the melting point depressing element, when the main metallic element of wiring member 3 is silver (Ag). The constituents of wiring member 3 and bonding material 4 are not limited to the above combination.

Alloy layer 5 is formed between wiring member 3 and bonding material 4. Alloy layer 5 is disposed between top 3C of wiring member 3 and joint surface 4T of bonding material 4. Alloy layer 5 is a joint that joins top SC to bonding material 4. Top 3C forms alloy layer 5 together with bonding material 4. Top 3C is joined to joint surface 4T with alloy layer 5 in between. The main constituents of alloy layer 5 are a metallic element and a melting point depressing element same as those of wiring member 3. The main constituents of alloy layer 5 do not melt at the melting point of the melting point depressing element.

Semiconductor element 6 is, for example, an insulated gate bipolar transistor (IGBT), a free wheel diode (FWD), or a metal oxide semiconductor field effect transistor (MOSFET) made of silicon (Si), silicon carbide (SIC), or the like. However, the type of semiconductor element 6 is not limited thereto. Although two semiconductor elements 6 are provided in FIG. 1, any number of semiconductor elements 6 may be provided.

Semiconductor element 6 includes pad 61 and a back surface electrode (not shown). Pad 61 is provided on the front surface of semiconductor element 6. The back surface electrode (not shown) is provided on the back surface of semiconductor element 6. Pad 61 is disposed opposite to the back surface electrode (not shown) with respect to the center of semiconductor element 6. Pad 61 is joined to bonding material 4.

Although pad 61 includes a control signal pad, a main electrode pad, and any other pad, the type of pad 61 is not limited thereto. Any one of the control signal pad and the main electrode pad may be provided as pad 61. In terms of electrical characteristics and mechanical characteristics, pad 61 is made of aluminum (Al), copper (Cu), silver (Ag), nickel (Ni), gold (Au), or an alloy mainly including one of them.

An element bonding material 62 is disposed between the back surface electrode (not shown) of semiconductor element 6 and circuit pattern 11 of first circuit 1. Element bonding material 62 is joined to both of the back surface electrode (not shown) of semiconductor element 6 and circuit pattern 11 of first circuit 1. Thus, the back surface electrode (not shown) of semiconductor element 6 and circuit pattern 11 of first circuit 1 are electrically connected to each other. Element bonding material 62 is disposed opposite to bonding material 4 with respect to semiconductor element 6. Element bonding material 62 is, for example, a high-temperature solder containing lead (Pb) and tin (Sn). However, the material for element bonding material 62 is not limited thereto. Element bonding material 62 may be made of, for example, a silver (Ag) nanoparticle paste or an electrically conductive adhesive containing a silver (Ag) particle, an epoxy resin, and the like.

Sealing resin 7 seals first circuit 1, second circuit 2, wiring member 3, bonding material 4, alloy layer 5, and semiconductor element 6. In other words, scaling resin 7 covers first circuit 1, second circuit 2, wiring member 3, bonding material 4, alloy layer 5, and semiconductor element 6. The surface of metallic layer 13 of first circuit 1, which is opposite to the surface joined to insulating layer 12, is exposed from sealing resin 7. The surface of second circuit 2, which is opposite to the surface joined to wiring member 3, is exposed from sealing resin 7.

Sealing resin 7 has insulation properties. Sealing resin 7 is, for example, a thermosetting resin. Note that the material for sealing resin 7 is not limited thereto. For example, sealing resin 7 may be a urethane resin, an epoxy resin, a polyimide resin, a polyamide resin, a polyamide-imide resin, an acrylic resin, or a rubber material. Sealing resin 7 may be formed of sealing resins 7. For example, sealing resin 7 may be formed by overlaying an epoxy resin on a gel silicon resin.

In semiconductor device 50, first circuit 1 and second circuit 2 are electrically connected to each other with wiring member 3, bonding material 4, alloy layer 5, semiconductor element 6, and element bonding material 62 in between. Second circuit 2 and wiring member 3 are joined to each other by direct bonding. Wiring member 3 and bonding material 4 are joined to each other with alloy layer 5 in between by liquid phase diffusion bonding. Wiring member 3 and bonding material 4 are electrically connected to each other with alloy layer 5 in between. Bonding material 4 and semiconductor element 6 are joined to each other at pad 61 of semiconductor element 6. Semiconductor element 6 and first circuit 1 are electrically connected to each other with element bonding material 62 in between. First circuit 1 and second circuit 2 are electrically connected to each other with wiring member 3, bonding material 4, and alloy layer 5 in between, without semiconductor element 6 and element bonding material 62 in between.

The configuration of semiconductor device 50 is not limited to the configuration described above. Semiconductor device 50 may be configured such that a housing is provided to surround the peripheries of first circuit 1, second circuit 2, wiring member 3, bonding material 4, and the semiconductor element and the housing is filled with sealing resin 7.

Figure 4:
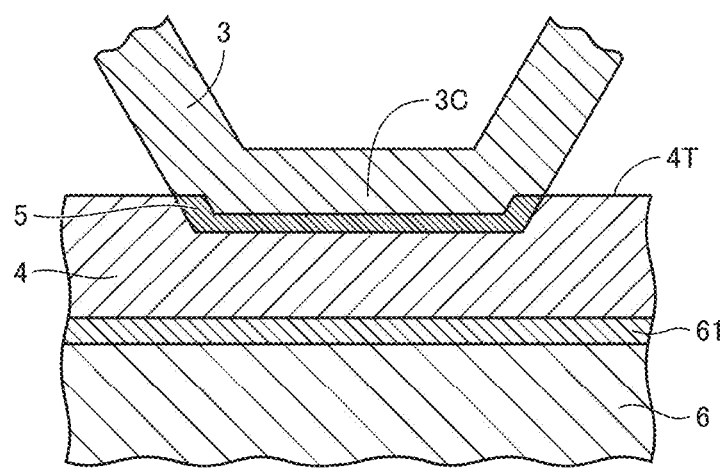
FIG. 4 is an enlarged view of a portion IV of FIG. 1.

Alloy layer 5 will be described in detail with reference to FIG. 4. FIG. 4 is an enlarged view of a portion IV of FIG. 1, which schematically shows alloy layer 5 according to Embodiment 1. Alloy layer 5 is made of an alloy of wiring member 3 and bonding material 4. By the action of the melting point depressing element included in bonding material 4, wiring member 3 and bonding material 4 melt at a temperature lower than the melting point of the main metallic element of wiring member 3 and bonding material 4. Bonding material 4 forms alloy layer 5 between wiring member 3 and bonding material 4 while wet-spreading to wiring member 3, followed by solidification (isothermal solidification). Alloy layer 5 is formed by so-called liquid phase diffusion bonding described above. The interface between wiring member 3 and bonding material 4 is firmly joined with alloy layer 5 in between. In this manner, a joint formed of alloy layer 5 is provided between top 3C of wiring member 3 and bonding material 4. This joint is formed as top 3C comes in bonding material 4, and accordingly, is provided along the bottom and the lateral portion of top 3C. This results in a larger joint than when the joint is provided along the bottom of top 3C. Top 3C has a large contact area between bonding material 4 and top 3C. Semiconductor element 6 and second circuit 2 are electrically connected to each other with bonding material 4 and alloy layer 5 in between.

Figure 5:
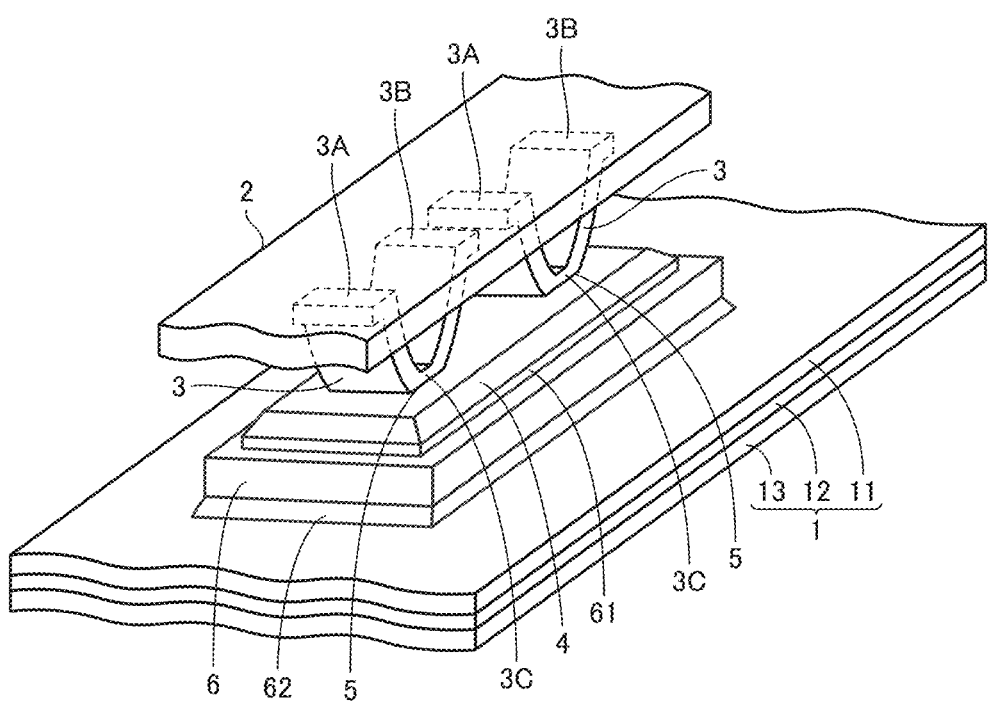
FIG. 5 is an enlarged perspective view corresponding to portion III of FIG. 1, which schematically shows a configuration of a variation of the semiconductor device according to Embodiment 1 of the present invention.

Wiring member 3 is a wire in FIG. 3, but wiring member 3 is not limited thereto. FIG. 5 is an enlarged perspective view corresponding to a portion III of FIG. 1, which schematically shows a configuration of a variation of the semiconductor device according to Embodiment 1. In the variation of semiconductor device 50 according to Embodiment 1, wiring member 3 is a plate-shaped member. In other words, wiring member 3 has a plate shape. Specifically, wiring member is shaped into a curved rectangular plate shape. In wiring member 3, the direction from first end 3A toward second end 3B is a longitudinal direction, and the direction orthogonal to the longitudinal direction is a traverse direction.

Figure 6:
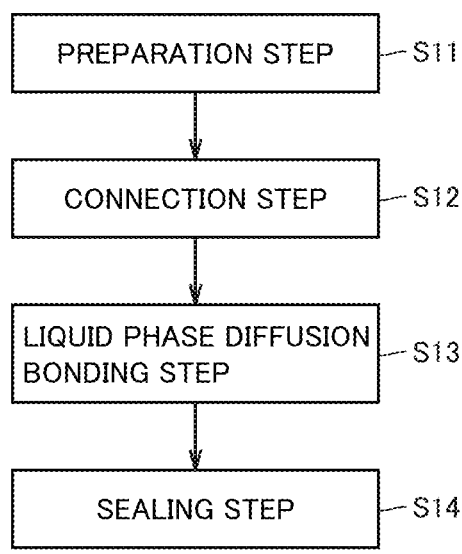
FIG. 6 is a flowchart showing a method of manufacturing the semiconductor device according to Embodiment 1 of the present invention.

A method of manufacturing semiconductor device 50 according, to the present embodiment will now be described with reference to FIG. 6. FIG. 6 is a flowchart showing the method of manufacturing, semiconductor device 50 according to the present embodiment. The method of manufacturing semiconductor device 50 in the present embodiment includes a preparation step S11, a connection step S12, a liquid phase diffusion bonding step S13, and a sealing step S14.

At preparation step S11, first circuit 1, second circuit 2, wiring member 3, and semiconductor element 6 are prepared.

At connection step S12 first end 3A and second end 3B of wiring member 3 are connected to one of first circuit 1 and second circuit 2. In the present embodiment, first end 3A and second end 3B of wiring member 3 are connected to second circuit 2. First end 3A and second end 3B of wiring member 3 are directly joined to second circuit 2. Semiconductor element 6 is joined to circuit pattern 11 of first circuit 1 with element bonding material 62 in between.

At liquid phase diffusion bonding step S13, top 3C of wiring member 3 is connected to the other of first circuit 1 and second circuit 2 with bonding material 4 in between. In the present embodiment, top 3C of wiring member 3 is connected to first circuit 1 with bonding material 4 in between. Top 3C of wiring member 3 and bonding material 4 are joined to each other by liquid phase diffusion bonding. Alloy layer 5 is formed between top 3C and bonding material 4 by liquid phase diffusion bonding. Bonding material 4 is disposed at least on pad 61 of semiconductor element 6 or on circuit pattern 11 of the first circuit. Top 3C of wiring member 3 and bonding material 4 are joined to each other by liquid phase diffusion bonding.

At sealing step S14, first circuit 1, second circuit 2, wiring member 3, bonding material 4, alloy layer 5, semiconductor element 6, and element bonding material 62 are sealed with sealing resin 7.

The functions and effects of the present embodiment will now be described.

In semiconductor device 50 according to the present embodiment, top 3C of wiring member 3 is connected to second circuit 2 with bonding material 4 in between. Since top 3C of wiring member 3 comes in bonding material 4, the contact area of the joint between top 3C of wiring member 3 and bonding material 4 is large. This leads to a large acceptable amount for the development of a crack in the joint after repeated application of thermal or mechanical fatigue to the joint. This results in a higher thermal resistance of the joint.

In semiconductor device 50 according to the present embodiment, top 3C of wiring member 3 forms alloy layer 5 together with bonding material 4. Thus, a firm joint interface can be formed in alloy layer 5, that is, the joint. This results in a higher thermal resistance of the joint.

Wiring member 3 has flexibility, and accordingly, can deform. Even when the height of bonding material 4 or semiconductor element 6 varies, thus, wiring member 3 can be joined to bonding material 4 or semiconductor element 6 as wiring member 3 deforms. In other words, even when bonding material 4 or semiconductor element 6 does not have a constant height, wiring member 3 deforms following the height of bonding material 4 or semiconductor element 6, thus allowing wiring member 3 to be joined to bonding material 4 or semiconductor element 6.

In semiconductor device 50 according to the present embodiment, wiring member 3 is a wire. Wiring member 3 can thus come in bonding material 4 easily.

In semiconductor device 50 according to the present embodiment, top 3C of wiring member 3 is connected to first circuit 1 with bonding material 4 disposed on pad 61 of semiconductor element 6 in between. This results in a higher thermal resistance of the joint between top 3C of wiring member 3 and bonding material 4 disposed on pad 61 of semiconductor element 6.

First end 3A and second end 3B of wiring member 3 are joined to second circuit 2 by direct bonding of metals without bonding material 4 in between. This can reduce an amount of bonding material 4 supplied, leading to a reduced manufacturing cost.

In semiconductor device 50 according to the present embodiment, semiconductor element 6 is a power semiconductor element. Semiconductor device 50 can thus operate as a power semiconductor device.

In semiconductor device 50 according to the present embodiment, sealing resin 7 covers first circuit 1, second circuit 2, wiring member 3, bonding material 4, and semiconductor element 6. Thus, sealing resin 7 can improve insulation reliability.

In the method of manufacturing semiconductor device 50 according to the present embodiment, top 3C of wiring member 3 and bonding material 4 are joined to each other by liquid phase diffusion bonding. This forms a firm joint interface at the joint, resulting in a higher thermal resistance of the joint. Top 3C of wiring member 3 and bonding material 4 are joined to each other by liquid phase diffusion bonding with wiring member 3 preliminary joined to second circuit 2, resulting in reduced misalignment during assembly. As a result, alignment of wiring member 3 and bonding material 4 is simplified.

In the method of manufacturing semiconductor device 50 according to the present embodiment, bonding material 4 is disposed on pad 61 of semiconductor element 6. This results in a higher thermal resistance of the joint between top 3C of wiring member 3 and bonding material 4 disposed on pad 61 of semiconductor element 6.

In the variation of semiconductor device 50 according to the present embodiment, wiring member 3 is a plate-shaped member. When wiring member 3 is a plate-shaped member, the joint of wiring member 3 is a flat surface. Contrastingly, when wiring member 3 is a wire, the joint of wiring member 3 is a curved surface. Thus, the contact area of the joint is larger when wiring member 3 is a plate-shaped member than when wiring member 3 is a wire. The degree of freedom in wiring routing is improved when wiring member 3 has a plate shape. Also, an inductance can be reduced when wiring member 3 has a plate shape.

In the case where wiring member 3 is a wire, the number of wiring members 3 needs to be changed in changing the current density of semiconductor device 50. Contrastingly, in the ease where wiring member 3 has a plate shape, even when the current density of semiconductor device 50 is changed, it suffices that the width or thickness of the plate is changed without changing the number of wiring members 3.

Embodiment 2

Embodiment 2 has the same configuration, manufacturing method, and functions and effects as those of Embodiment 1 described above unless otherwise specified. Thus, the same components as those of Embodiment 1 have the same reference characters allotted, description of which will not be repeated.

Figure 7:
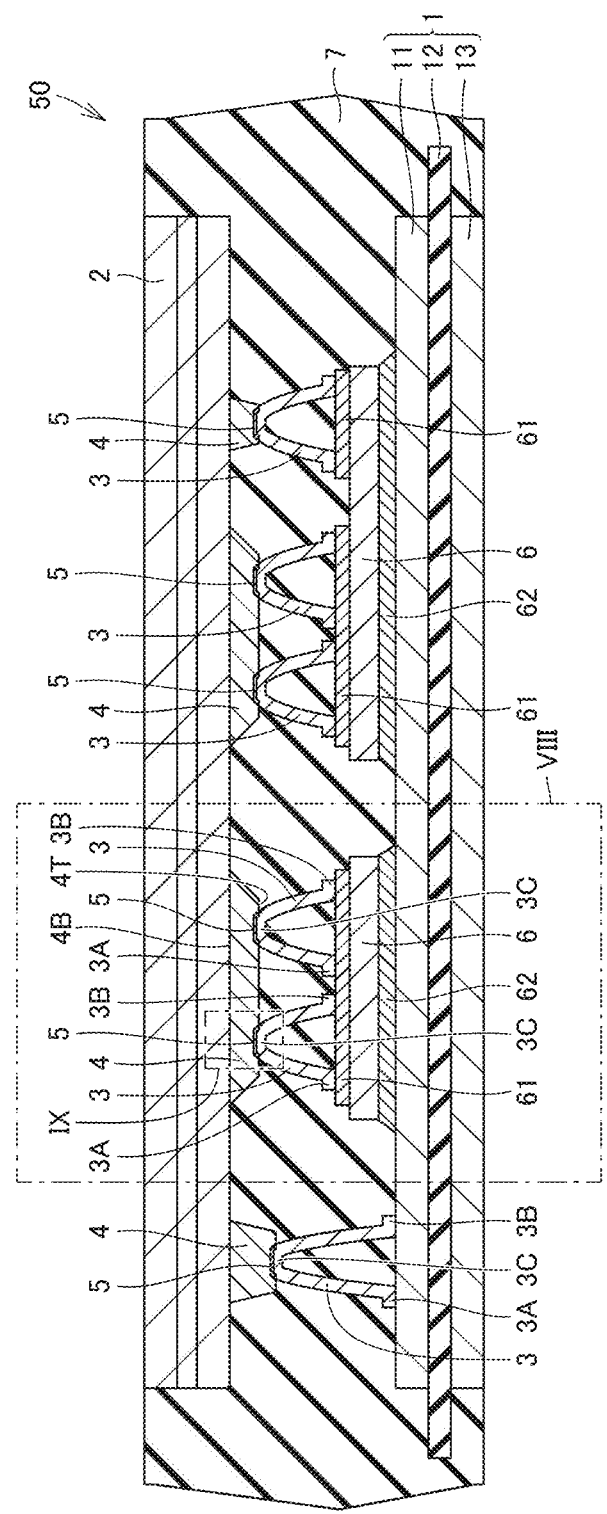
FIG. 7 is a sectional view schematically showing a configuration of a semiconductor device according to Embodiment 2 of the present invention.
Figure 8:
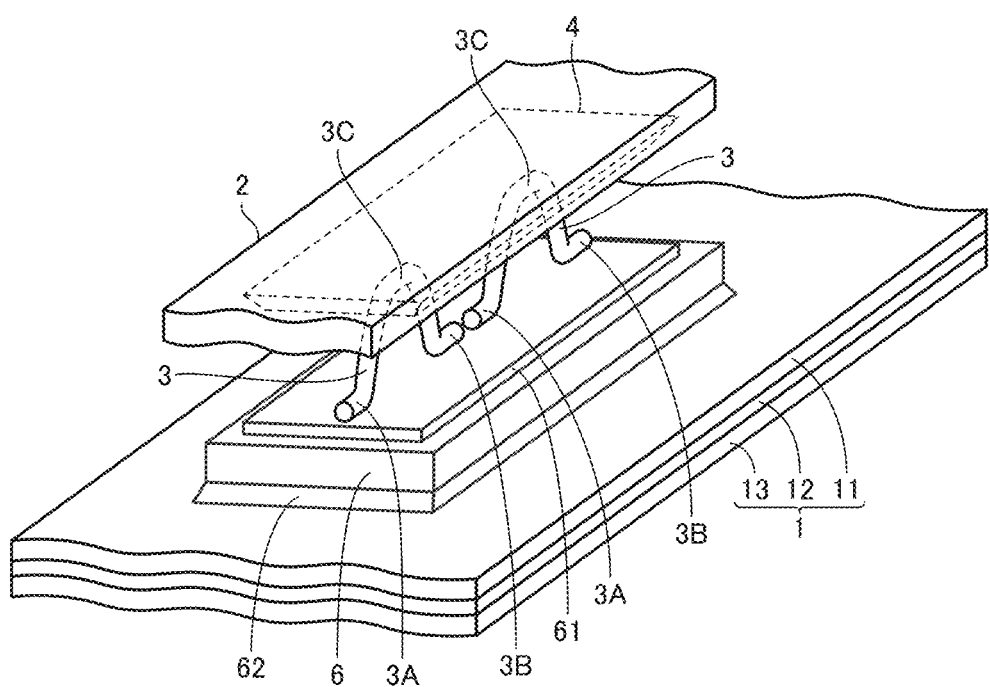
FIG. 8 is an enlarged perspective view of a portion VIII of FIG. 7, which schematically shows the configuration of the semiconductor device according to Embodiment 2 of the present invention.

The configuration of semiconductor device 50 according to Embodiment 2 will be described with reference to FIGS. 7 and 8. FIG. 7 is a sectional view schematically showing the configuration of semiconductor device 50 according to Embodiment 2. FIG. 8 is an enlarged perspective view of a portion VIII of FIG. 7, which schematically shows the configuration of semiconductor device 50 according to Embodiment 2. For convenience of description, FIG. 8 does not show sealing resin 7.

First end 3A and second end 3B of wiring member 3 according to the present embodiment are connected to circuit pattern 11 of first circuit 1 or pad 61 of semiconductor element 6. Specifically, first end 3A and second end 3B are directly joined to circuit pattern 11 of first circuit 1. First end 3A and second end 3B are directly joined to pad 61 of semiconductor element 6. First end 3A and second end 3B of wiring member 3 are connected to circuit pattern 11 or pad 61 of one semiconductor element 6 in FIG. 7, but the location of connection of wiring member 3 is not limited thereto. For example, one of first end 3A and second end 3B of wiring member 3 may be connected to circuit pattern 11, and the other end may be connected to pad 61. Top 3C is connected to second circuit 2 with bonding material 4 in between.

In the present embodiment, bonding material 4 is disposed on second circuit 2. In other words, bonding material 4 is joined to second circuit 2. Also in the present embodiment, joint surface 4T is a surface of bonding material 4 which is joined to top 3C. Contrastingly, in the present embodiment, back surface 4B is a surface of bonding material 4 which is joined to second circuit 2, unlike in Embodiment 1. Bonding material 4 according to the present embodiment is in contact with neither semiconductor element 6 nor the first circuit.

In semiconductor device 50 according to the present embodiment, first circuit 1 and second circuit 2 are electrically connected to each other with wiring member 3, bonding material 4, alloy layer 5, semiconductor element 6, and element bonding material 62 in between. Second circuit 2 and wiring member 3 are joined to each other with bonding material 4 and alloy layer 5 in between. Wiring member 3 and bonding material 4 are joined to each other with alloy layer 5 in between by liquid phase diffusion bonding. Wiring member 3 and pad 61 of semiconductor element 6 are joined to each other by direct bonding Semiconductor element 6 and first circuit 1 are electrically connected to each other with bonding material 62 in between. The first circuit and second circuit 2 are electrically connected to each other with wiring member 3, bonding material 4, and alloy layer 5 in between, without semiconductor element 6 and element bonding material 62 in between.

Figure 9:
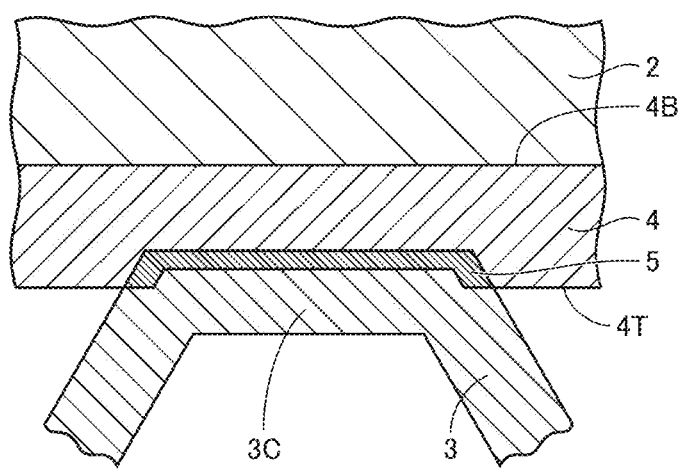
FIG. 9 is an enlarged view of a portion IX of FIG. 7.

Alloy layer 5 according to the present embodiment will be described in detail with reference to FIG. 9. FIG. 9 is an enlarged view of a portion IX of FIG. 7, which schematically shows alloy layer 5 according to Embodiment 2. Alloy layer 5 is formed between wiring member 3 and bonding material 4. Wiring member 3 and bonding material 4 are electrically connected to each other by alloy layer 5.

Figure 10:
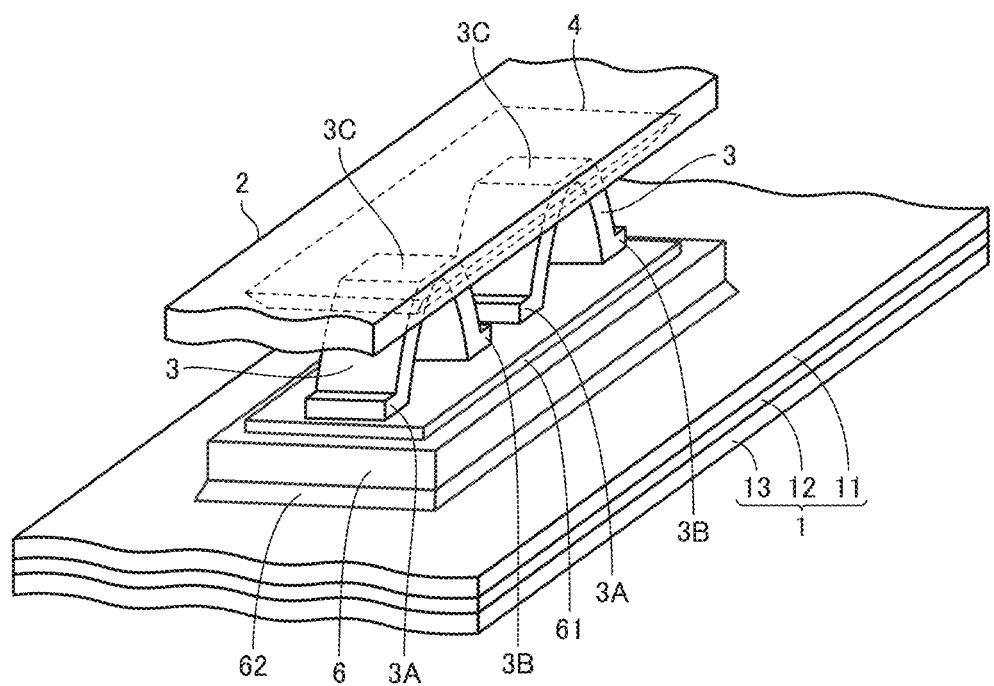
FIG. 10 is an enlarged perspective view corresponding to portion VIII of FIG. 7, which schematically shows a configuration of a variation of the semiconductor device according to Embodiment 2 of the present invention.

Wiring member 3 has a wire shape in FIG. 8, but the shape of wiring member 3 is not limited thereto. FIG. 10 is an enlarged perspective view corresponding to a portion VIII of FIG. 7, which schematically shows a configuration of a variation of the semiconductor device according to Embodiment 2. In the variation of semiconductor device 50 according to Embodiment 2, wiring member 3 has a plate shape.

A method of manufacturing semiconductor device 50 according to the present embodiment will now be described.

At connection step S12 according to the present embodiment, first end 3A and second end 3B of wiring member 3 are connected to first circuit 1. First end 3A and second end 3B of wiring member 3 are directly joined to first circuit 1. First end 3A and second end 3B of wiring member 3 are connected to pad 61 of semiconductor element 6. First end 3A and second end 38 of wiring member 3 are directly joined to pad 61 of semiconductor element 6.

At liquid phase diffusion bonding step S13, bonding material 4 is disposed on second circuit 2. Top 3C of wiring member 3 and bonding material 4 are joined to each other by liquid phase diffusion bonding.

The functions and effects of the present embodiment will now be described.

In semiconductor device 50 according to the present embodiment, top 3C of wiring member 3 is connected to second circuit 2 with bonding material 4 disposed on second circuit 2 in between. This results in a higher thermal resistance of the joint between top 3C of wiring member 3 and bonding material 4 disposed on second circuit 2.

First end 3A and second end 311 of wiring member 3 are joined to pad 61 of semiconductor element 6 by direct bonding of metals without bonding material 4 in between. This can reduce an amount of bonding material 4 supplied, leading to a reduced manufacturing cost.

In the method of manufacturing semiconductor device 50 according to the present embodiment, bonding material 4 is disposed on second circuit 2. This results in a higher thermal resistance of the joint between top 3C of wiring member 3 and bonding material 4 disposed on second circuit 2.

In the method of manufacturing semiconductor device 50 according to the present embodiment, top 3C of wiring member 3 and bonding material 4 are joined to each other by liquid phase diffusion bonding with wiring member 3 preliminary joined to first circuit 1 or pad 61 of semiconductor element 6, resulting in reduced misalignment during assembly. As a result, alignment of wiring member 3 and bonding material 4 is simplified.

In the present embodiment, further, bonding material 4 is disposed only on second circuit 2. Contrastingly, in Embodiment 1, bonding material 4 is disposed on first circuit 1 and semiconductor element 6. Thus, the manufacturing steps of the present embodiment are more simplified than the manufacturing steps of Embodiment 1. As second circuit 2 is shaped into, for example, a flat plate, the arrangement of bonding material 4 can be more simplified. Thus, the manufacturing steps of the present embodiment are more simplified than the manufacturing steps of Embodiment 1.

Embodiment 3

Embodiment 3 has the same configuration, manufacturing method, and functions and effects as those of Embodiment 1 described above unless otherwise specified. The same components as those of Embodiment 1 have the same reference characters allotted, description of which will not be repeated.

Figure 11:
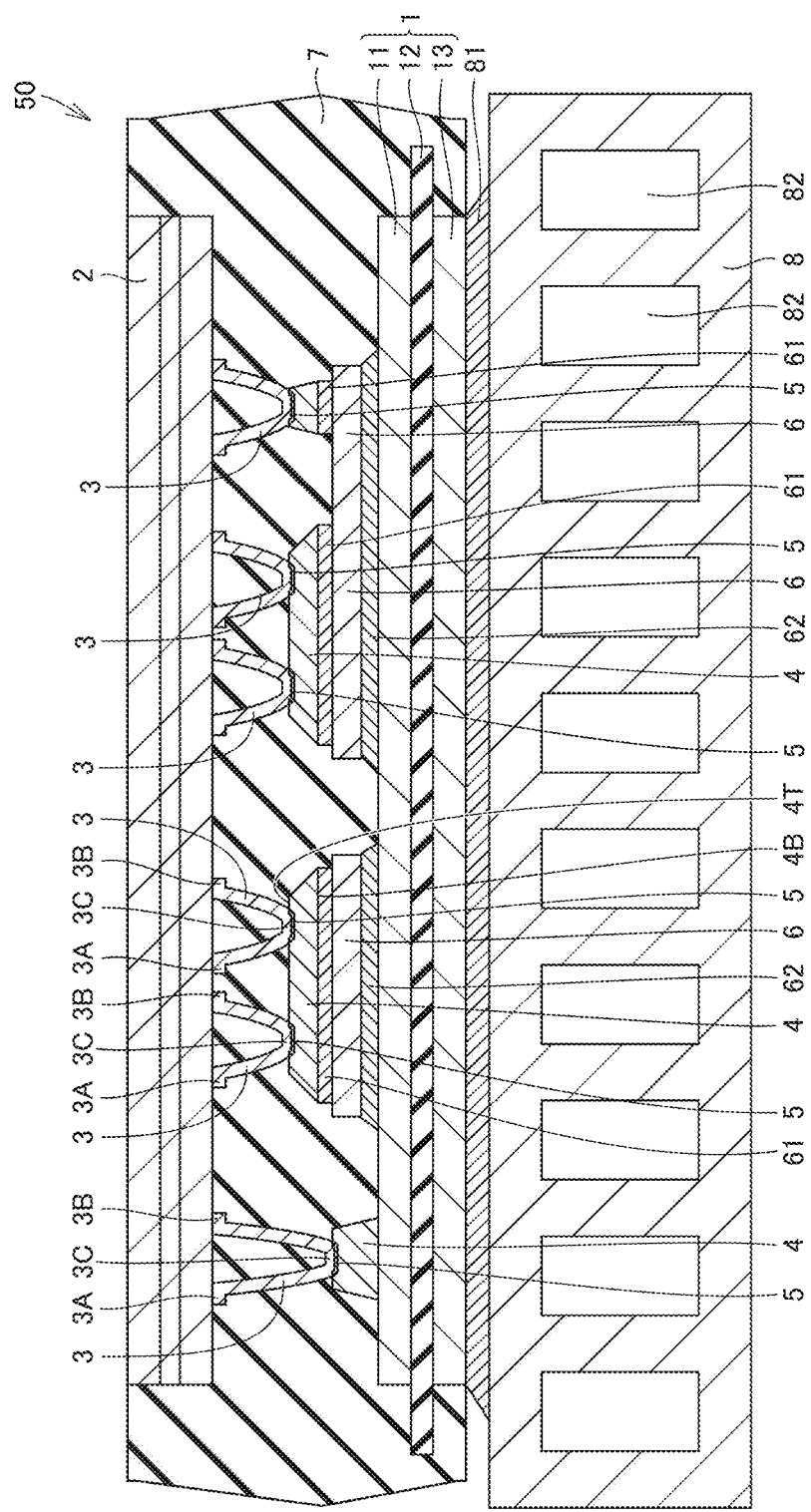
FIG. 11 is a sectional view schematically showing a configuration of a semiconductor device according to Embodiment 3 of the present invention.

The configuration of semiconductor device 50 according to the present embodiment will be described with reference to FIG. 11. FIG. 11 is a sectional view schematically showing the configuration of semiconductor device 50 according to the present embodiment. Semiconductor device 50 of the present embodiment is different from semiconductor device 50 according to Embodiment 1 in that it further includes a cooler 8 in addition to the components of Embodiment 1.

Cooler 8 dissipates the heat generated during operation of semiconductor device 50 to the outside. Thus, cooler 8 is preferably made of a material having excellent thermal conductivity. The material of cooler 8 is, for example, aluminum (Al), copper (Cu), and an alloy mainly including any of them, or a composite material (Al—SiC) of silicon carbide (SiC) and aluminum (Al). Note that the material for cooler 8 is not limited thereto.

Cooler 8 is connected to first circuit 1. Cooler 8 is disposed opposite to semiconductor element 6 with respect to first circuit 1. Specifically, cooler 8 is connected to metallic layer 13 of first circuit 1 with a metallic joining layer 81 in between. Metallic joining layer 81 is provided between metallic layer 13 of first circuit 1 and cooler 8. The material of metallic joining layer 81 is, for example, a high-temperature solder containing lead (Pb) and tin (Sn). However, the material for metallic joining layer 81 is not limited thereto. The material of metallic joining layer 81 may be, for example, a silver (Ag) nanoparticle paste or an electrically conductive adhesive including a silver (Ag) particle and an epoxy resin.

In FIG. 11, cooler 8 is provided with a flow path for facilitating heat exchange between refrigerant (not shown) and cooler 8. However, the configuration of cooler 8 is not limited thereto.

The functions and effects of the present embodiment will now be described.

In semiconductor device 50 according to the present embodiment, cooler 8 is connected to first circuit 1, thus improving the cooling performance of semiconductor device 50. Thus, higher heat dissipation performance can be obtained.

The joint between wiring member 3 and bonding material 4 of semiconductor device 50 is formed of alloy layer 5, leading to a higher thermal resistance. This leads to a higher temperature at which metallic joining layer 81 is joined to semiconductor device 50.

Embodiment 4

In the present embodiment, the semiconductor device according to Embodiment 1, 2, 3 described above is used in a power converter. Although the present invention is not limited to the power converter, description will be given of a case where the present invention is applied to a three-phase inverter as Embodiment 4.

Figure 12:
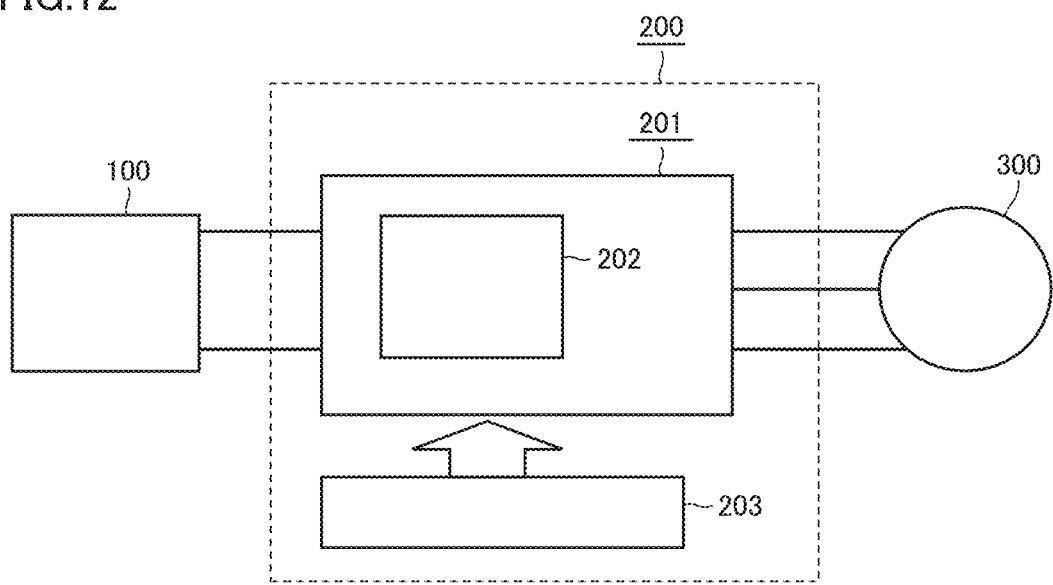
FIG. 12 is a block diagram showing a configuration of a power conversion system according to Embodiment 4 of the present invention.

FIG. 12 is a block diagram showing a configuration of a power conversion system in which the power converter according to the present embodiment is used.

The power conversion system shown in FIG. 12 is composed of a power supply 100, a power converter 200, and a load 300. Power supply 100 is a direct-current (DC) power supply and supplies DC power to power converter 200. Power supply 100 may be configured of various components, and for example, may be configured of a DC system, a solar battery, or a storage battery, or may be configured of a rectifier circuit connected to an alternating-current (AC) system or an AC/DC converter. Power supply 100 may be configured of a DC/DC converter that converts DC power output from the DC system to predetermined power.

Power converter 200 is a three-phase inverter connected between power supply 100 and load 300. Power converter 200 converts the DC power supplied from power supply 100 into AC power and supplies the AC power to load 300.

Power converter 200 includes a main conversion circuit 201, which converts DC power into AC power and outputs the AC power, and a control circuit 203, which outputs a control signal for controlling main conversion circuit 201 to main conversion circuit 201, as shown in FIG. 12.

Load 300 is a three-phase electric motor driven by the AC power supplied from power converter 200. Note that load 300 is not limited to specific use. Load 300 is an electric motor mounted in various electrical devices and is used as, for example, an electric motor for a hybrid vehicle, an electric vehicle, a rail vehicle, an elevator, or air-conditioning equipment.

Power converter 200 will now be described in detail. Main conversion circuit 201 includes a switching element and a reflux diode (which are not shown), and upon switching of the switching element, converts DC power supplied from power supply 100 into AC power and supplies the AC power to load 300. Main conversion circuit 201 may have various circuit configurations. Main conversion circuit 201 according to the present embodiment is a two-level, three-phase full-bridge circuit and can be composed of six switching elements and six reflux diodes, each of which is connected in anti-parallel with a corresponding one of the switching elements. The switching element and the reflux diode of main conversion circuit 201 are each composed of a semiconductor module 202 which corresponds to any one of Embodiment 1 to Embodiment 4 described above. The six switching elements are connected in series for every two switching elements to constitute upper-lower arms, and each upper-lower arm forms a corresponding one of phases (U phase, V phase, W phase) of the full-bridge circuit. The output terminals of the respective upper-lower arms, that is, three output terminals of main conversion circuit 201 are connected to load 300.

Although main conversion circuit 201 includes a drive circuit (not shown) that drives the switching elements, the drive circuit may be incorporated in semiconductor module 202, or a drive circuit may be provided separately from semiconductor module 202. The drive circuit generates a drive signal for driving the switching element of main conversion circuit 201 and supplies the drive signal to a control electrode of the switching element of main conversion circuit 201. Specifically, the drive circuit outputs a drive signal for turning on the switching element and a drive signal for turning off the switching element to the control electrode of each switching element in accordance with the control signal from control circuit 203, which will be described below. The drive signal is a voltage signal (ON signal) of not less than a threshold voltage of the switching element when the switching element is kept in ON state, and the drive signal is a voltage signal (OFF signal) of not greater than the threshold voltage of the switching element when the switching element is kept in OFF state.

Control circuit 203 controls the switching elements of main conversion circuit 201 such that desired power is supplied to load 300. Specifically, control circuit 203 calculates a time (ON time) in which each switching element of main conversion circuit 201 should be turned on based on power to be supplied to load 300. For example, control circuit 203 can control main conversion circuit 201 by PWM control that modulates ON time of the switching element in accordance with a voltage to be output Control circuit 203 then outputs a control command (control signal) to the drive circuit included in main conversion circuit 201 such that ON signal is output to the switching element to be turned on and OFF signal is output to a switching element to be turned off at each point of time. The drive circuit outputs ON signal or OFF signal as a drive signal to the control electrode of each switching element in accordance with the control signal.

The semiconductor module according to any one of Embodiment 1 to Embodiment 3 is used in the power converter according to the present embodiment as the switching element and the reflux diode of main conversion circuit 201, leading to improved reliability of the power converter.

Although the present embodiment has described an example where the present invention is applied to a two-level, three-phase inverter, the present invention is not limited thereto and is applicable to various power converters. Although the present invention is directed to a two-level power converter in the present embodiment, the present invention may be directed to a three-level or multilevel power converter. When power is supplied to a single-phase load, the present invention is applicable to a single-phase inverter. When power is supplied to a DC load or the like, the present invention is also applicable to a DC/DC converter or an AC/DC converter.

The power converter to which the present invention is applied is not limited to the case where a load is an electric motor as described above, and may be used as a power supply device of an electric discharge machine, a laser beam machine, an induction cooker, or a non-contact feed system, and further, may be used as a power conditioner of a photovoltaic generation system or an electricity storage system.

The above embodiments can be combined as appropriate.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

1 first circuit; 2 second circuit; 3 wiring member; 3A first end; 3B second end; 3C top; 4 bonding material; 5 alloy layer; 6 semiconductor element; 7 sealing resin; 8 cooler; 50 semiconductor device; 61 pad; 100 power supply; 200 power converter; 201 main conversion circuit; 202 semiconductor module; 203 control circuit; 300 load.

The invention claimed is:

1. A semiconductor device comprising:
   a first circuit;
   a second circuit;
   a wiring member connected to one of the first circuit and the second circuit;
   a bonding material connected to the other of the first circuit and the second circuit; and
   a semiconductor element,
      the wiring member including a first end, a second end, and a top, the first end and the second end being connected to one of the first circuit and the second circuit, the top being located between the first end and the second end,
      the top being connected to the other of the first circuit and the second circuit with the bonding material in between,
      the semiconductor element including a pad,
      the bonding material being disposed on the pad of the semiconductor element,
      the first end and the second end being directly joined to the second circuit,
      the top being connected to the first circuit with the bonding material and the semiconductor element in between.

2. The semiconductor device according to claim 1, wherein
   the top forms an alloy layer together with the bonding material, and
   main constituents of the alloy layer are a metallic element and a melting point depressing element same as those of the wiring member.

3. The semiconductor device according to claim 1, wherein the wiring member is a wire.

4. The semiconductor device according to claim 1, wherein the wiring member is a plate-shaped member.

5. The semiconductor device according to claim 1, wherein the semiconductor element is a power semiconductor element.

6. The semiconductor device according to claim 1, further comprising a sealing resin,
   wherein the sealing resin covers the first circuit, the second circuit, the wiring member, the bonding material, and the semiconductor element.

7. The semiconductor device according to claim 1, further comprising a cooler,
   wherein the cooler is connected to the first circuit and is disposed opposite to the semiconductor element with respect to the first circuit.

8. A power converter comprising:
   a main conversion circuit including a semiconductor device according to claim 1, the main conversion circuit converting received power and outputs the converted power; and
   a control circuit to output a control signal for controlling the main conversion circuit to the main conversion circuit.

* * * * *